United States Patent
Kim et al.

(10) Patent No.: US 9,048,449 B2
(45) Date of Patent: Jun. 2, 2015

(54) ORGANIC LIGHT EMITTING DISPLAY APPARATUS HAVING A LIGHT CONVERSION LAYER

(75) Inventors: Mu-Gyeom Kim, Yongin (KR);
Hye-Hyang Park, Yongin (KR);
Hyun-Sun Park, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 918 days.

(21) Appl. No.: 12/926,153

(22) Filed: Oct. 28, 2010

(65) Prior Publication Data

US 2011/0215305 A1 Sep. 8, 2011

(30) Foreign Application Priority Data

Mar. 2, 2010 (KR) .................. 10-2010-0018567

(51) Int. Cl.
*H01L 29/10* (2006.01)
*H01L 29/12* (2006.01)
*H01L 51/52* (2006.01)

(52) U.S. Cl.
CPC ..................... *H01L 51/52* (2013.01)

(58) Field of Classification Search
CPC ............ H01L 27/3244; H01L 27/3248; H01L 27/3258; H01L 27/326; H01L 27/32; H01L 29/7869
USPC .......... 257/E51.022, E33.013, 40, 43, 59, 72, 257/79, 80, 81, 82, 83, 84, 99, 103, 66, 57; 438/104, 128, 754, 85, 86, 151, 149, 438/166
See application file for complete search history.

(56) References Cited

U.S. PATENT DOCUMENTS

| | | | |
|---|---|---|---|
| 5,932,895 A | 8/1999 | Shen et al. | |
| 7,166,959 B2 | 1/2007 | Suzuki et al. | |
| 8,319,217 B2* | 11/2012 | Kim et al. | 257/43 |
| 2005/0140277 A1 | 6/2005 | Suzuki et al. | |
| 2007/0285411 A1 | 12/2007 | Yang et al. | |
| 2008/0237585 A1* | 10/2008 | Kim | 257/40 |
| 2009/0057674 A1* | 3/2009 | Jeong et al. | 257/59 |
| 2009/0250693 A1* | 10/2009 | Jeong et al. | 257/43 |
| 2009/0294772 A1* | 12/2009 | Jeong et al. | 257/59 |
| 2009/0295282 A1 | 12/2009 | Yoon et al. | |
| 2009/0315026 A1* | 12/2009 | Jeong et al. | 257/43 |
| 2009/0321731 A1* | 12/2009 | Jeong et al. | 257/43 |
| 2009/0321732 A1* | 12/2009 | Kim et al. | 257/43 |

(Continued)

FOREIGN PATENT DOCUMENTS

| | | | |
|---|---|---|---|
| KR | 10 2004-0048235 A | 6/2004 | |
| KR | 10 2005-0067067 A | 6/2005 | |
| KR | 10 2007-0041240 A | 4/2007 | |
| KR | 10-2007-0050723 A | 5/2007 | |

(Continued)

OTHER PUBLICATIONS

Korean Notice of Allowance in KR 10-2010-0018567, dated Jan. 20, 2012 (Kim, et al.).

*Primary Examiner* — Thanh Y Tran
(74) *Attorney, Agent, or Firm* — Lee & Morse, P.C.

(57) ABSTRACT

An organic light emitting display apparatus includes a substrate, a light conversion layer on the substrate, the light conversion layer including an oxide semiconductor, a passivation layer covering the light conversion layer, a first electrode on the passivation layer, an intermediate layer on the first electrode, the intermediate layer including an organic emission layer, and a second electrode on the intermediate layer.

8 Claims, 5 Drawing Sheets

(56) References Cited

U.S. PATENT DOCUMENTS

2010/0026169 A1* 2/2010 Jeong et al. .................. 313/504
2010/0176394 A1* 7/2010 Park et al. ..................... 257/43
2011/0220888 A1* 9/2011 Choi et al. .................... 257/43

FOREIGN PATENT DOCUMENTS

| KR | 10 2007-0096082 A | 10/2007 |
| KR | 10-0776498 B1 | 11/2007 |
| KR | 10 2009-0123536 A | 12/2009 |

* cited by examiner

ORGANIC LIGHT EMITTING DISPLAY APPARATUS HAVING A LIGHT CONVERSION LAYER

BACKGROUND

1. Field

Embodiments relate to an organic light emitting display apparatus.

2. Description of the Related Art

Recently, display apparatuses have been formed as thin portable flat panel display apparatuses. Organic electroluminescent display devices, as a self-emitting display device from among such flat panel display apparatuses, have drawn attention as next generation display devices due to advantages such as a wide viewing angle, a good contrast, and a fast response rate. Organic light-emitting display apparatuses using an organic compound for an emission layer have superior brightness, driving voltage, and response time characteristics as compared to inorganic light-emitting apparatuses using an inorganic compound for an emission layer, and can realize multi-colored displays.

In an organic light emitting display apparatus, an organic emission layer is interposed between a cathode and an anode, and, when a voltage is applied to the cathode and the anode, the organic emission layer connected to the cathode and the anode emits visible light.

The visible light emitted from the organic emission layer becomes extinguished while sequentially passing through the cathode or anode and the other members such as a polarization layer. Accordingly, there are limitations in the luminescent efficiency of organic light emitting display apparatuses from the viewpoint of users.

SUMMARY

It is a feature of an embodiment to provide an organic light emitting display apparatus having improved luminescent efficiency.

At least one of the above and other features and advantages may be realized by providing an organic light emitting display apparatus, including a substrate, a light conversion layer on the substrate, the light conversion layer including an oxide semiconductor, a passivation layer covering the light conversion layer, a first electrode on the passivation layer, an intermediate layer on the first electrode, the intermediate layer including an organic emission layer, and a second electrode on the intermediate layer.

The light conversion layer may be disposed on a path where light generated by the intermediate layer travels.

The light conversion layer may have a higher refractive index than a refractive index of the passivation layer.

The passivation layer may include silicon oxide.

The organic light emitting display apparatus may further include a buffer layer disposed between the substrate and the light conversion layer.

The buffer layer may include silicon nitride.

The light conversion layer may be formed in a predetermined pattern so as to include a plurality of through holes.

The organic light emitting display apparatus may further include a thin film transistor disposed between the passivation layer and the substrate, the thin film transistor being electrically connected to the first electrode, the thin film transistor including a gate electrode, an active layer, a source electrode, and a drain electrode.

The active layer may be formed of a material used to form the light conversion layer.

The active layer may be formed on a layer on which the light conversion layer is formed.

A gate insulating film may insulate the gate electrode from the active layer, and the gate insulating film may be between the substrate and the light conversion layer.

The gate insulating film may include silicon oxide.

The organic light emitting display apparatus may further include an etch stopper between the active layer, the source electrode, and the drain electrode.

The etch stopper may be between the light conversion layer and the passivation layer.

The etch stopper may include a plurality of through holes, the through holes exposing portions of the light conversion layer.

The etch stopper may include silicon oxide.

The source electrode or the drain electrode may extend so as to reach an edge of the light conversion layer in order to block light from flowing into regions around the light conversion layer, and the source electrode or the drain electrode that extends so as to reach the edge of the light conversion layer may include a through hole that faces the light conversion layer.

The source electrode or the drain electrode that extends so as to reach the edge of the light conversion layer may surround the edge of the light conversion layer.

The organic light emitting display apparatus may further include a light blocking layer disposed between the substrate and the light conversion layer, the light blocking layer blocking light from flowing into regions around the light conversion layer.

The light blocking layer may include a through hole that faces the light conversion layer.

The light blocking layer may be formed of a material used to form the gate electrode.

Light generated by the intermediate layer may be emitted toward the substrate.

An organic light emitting display apparatus, including a first subpixel, a second subpixel, and a third subpixel on a substrate. Each of the first, second, and third subpixels may include a passivation layer on the substrate, a first electrode on the passivation layer, an intermediate layer on the first electrode and including an organic emission layer, and a second electrode on the intermediate layer. The second subpixel may further include a second subpixel light conversion layer that includes an oxide semiconductor, the second subpixel light conversion layer being on the substrate, and the second subpixel passivation layer being on the light conversion layer. The third subpixel may further include a third subpixel light conversion layer on the substrate, and further include an insulation layer on the third subpixel light conversion layer, the third subpixel light conversion layer including an oxide semiconductor, the third subpixel passivation layer being on the insulation layer.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Korean Patent Application No. 10-2010-0018567, filed on Mar. 2, 2010, in the Korean Intellectual Property Office, and entitled: "Organic Light Emitting Display Apparatus," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 1:
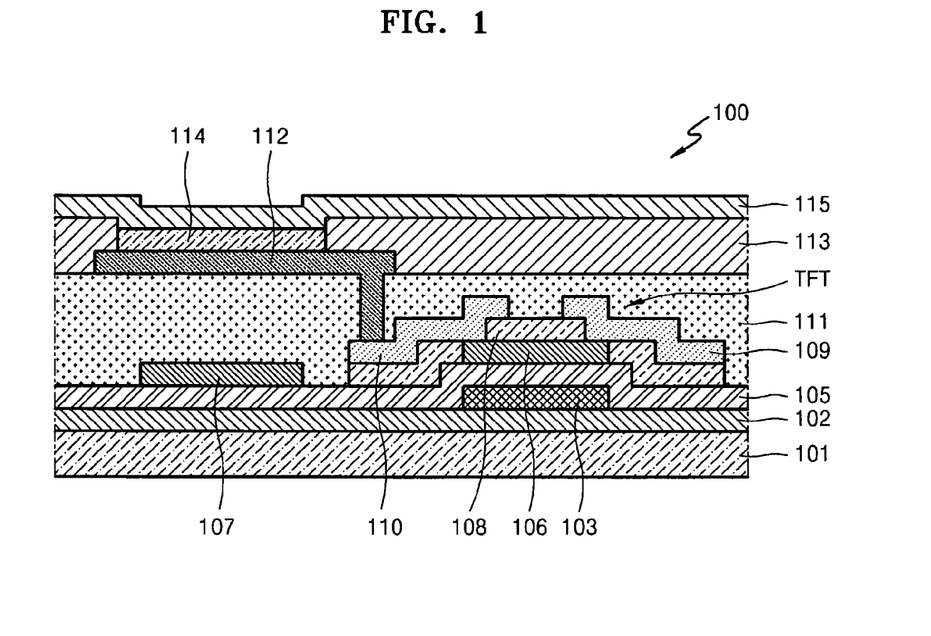
FIG. 1 illustrates a schematic cross-sectional view of an organic light emitting display apparatus according to an embodiment.

FIG. 1 illustrates a schematic cross-sectional view of an organic light emitting display apparatus 100 according to an embodiment.

In the example embodiment shown in FIG. 1, the organic light emitting display apparatus 100 includes a substrate 101, a thin film transistor TFT, a light conversion layer 107, a passivation layer 111, a first electrode 112, an intermediate layer 114, and a second electrode 115. The thin film transistor TFT includes a gate electrode 103, an active layer 106, a source electrode 109, and a drain electrode 110. Although not shown in FIG. 1, embodiments may be applied to passive matrix (PM) type organic light emitting display apparatuses including no thin film transistors.

In more detail, in the embodiment shown in FIG. 1, the substrate 101 may be formed of, e.g., a transparent glass that includes silicon oxide ($SiO_2$) as a main component. The substrate 101 is not limited thereto, and the substrate 101 may be formed of a transparent plastic. The transparent plastic used to form the substrate 101 may be an organic material, e.g., an insulative organic material such as polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), or cellulose acetate propionate (CAP).

In the example embodiment shown in FIG. 1, a buffer layer 102 is formed on the substrate 101. The buffer layer 102 provides a flat surface on top of the substrate 101 and prevents moisture and foreign substances from penetrating into the substrate 101. The buffer layer 102 may include silicon nitride (SiNx) having a relatively high refractive index.

In the example embodiment shown in FIG. 1, the gate electrode 103 is formed on the buffer layer 102. The gate electrode 103 may be formed a metal or a metal alloy such as Au, Ag, Cu, Ni, Pt, Pd, Al, Mo, Al:Nd alloy, Mo:W alloy, or the like. However, the present invention is not limited thereto, and the gate electrode 103 may be formed of any of various conductive materials.

In the example embodiment shown in FIG. 1, a gate insulating film 105 is formed on the gate electrode 103. The gate electrode 103 and the active layer 106 are insulated from each other by the gate insulating film 105. The gate insulating film 105 includes a material having a lower refractive index than that of the buffer layer 102, which contacts the gate insulating film 105. For example, the gate insulating film 105 may include silicon oxide ($SiO_x$).

In the example embodiment shown in FIG. 1, the active layer 106 is formed on the gate insulating film 105. The active layer 106 may include any of various materials. The active layer 106 may include an oxide semiconductor.

In the example embodiment shown in FIG. 1, the light conversion layer 107 is formed on the gate insulating film 105 and includes the same material as the material used to form the active layer 106. In other words, the light conversion layer 107 includes the oxide semiconductor used to form the active layer 106. The light conversion layer 107 including the oxide semiconductor may absorb light in a specific wavelength band. Since the refractive index of the oxide semiconductor is higher than that of silicon oxide, the light conversion layer 107 including the oxide semiconductor reflects a part of visible light emitted from the intermediate layer 114, thereby obtaining a microcavity effect in which light may resonate.

In the example embodiment shown in FIG. 1, an etch stopper 108 is formed on the active layer 106. The source electrode 109 and the drain electrode 110 are formed on the etch stopper 108. The source electrode 109 and the drain electrode 110 contact portions of the active layer 106 that are not covered with the etch stopper 108 and that are exposed. Thus, a portion of the upper surface of the active layer 106 functioning as a channel is protected by the etch stopper 108. When the source electrode 109 and the drain electrode 110 are patterned by etching, an upper surface of the active layer 106 may be damaged. This damage may be prevented by the etch stopper 108.

In the example embodiment shown in FIG. 1, the etch stopper 108 includes a material having a lower refractive index than that of the light conversion layer 107. In detail, the etch stopper 108 may include silicon oxide ($SiO_2$).

The source electrode 109 and the drain electrode 110 may be formed of metal such as Au, Pd, Pt, Ni, Rh, Ru, Ir, or Os, or may be formed of an alloy of various materials, such as Al, Mo, Al:Nd alloy, MoW alloy, or the like, but the present embodiment is not limited thereto.

In the example embodiment shown in FIG. 1, the passivation layer 111 is formed on the light conversion layer 107, the source electrode 109, and the drain electrode 110. The passivation layer 111 may be formed of any of various insulating materials. The passivation layer 111 may be formed of an insulating material having a lower refractive index than that of a material used to form the light conversion layer 107. In detail, the passivation layer 111 may include silicon oxide.

In the example embodiment shown in FIG. 1, the first electrode 112 is formed on the passivation layer 111. The first electrode 112 is electrically connected to the drain electrode 110. The first electrode 112 may include ITO, IZO, ZnO, AZO (aluminum-doped zinc oxide), or $In_2O_3$, each having a relatively high work function. The first electrode 112 may have a multi-layered thin film structure including Ag.

In the example embodiment shown in FIG. 1, a pixel defining film 113 is formed on the first electrode 112. The pixel defining film 113 includes any of various insulating materials, is formed to expose a predetermined portion of the first electrode 112, and forms the intermediate layer 114 on the exposed portion of the first electrode 112. The second electrode 115 is formed on the intermediate layer 114.

In the example embodiment shown in FIG. 1, the intermediate layer 114 includes an organic emission layer (not shown). When a voltage is applied to the first electrode 112 and the second electrode 115, visible light is emitted from the organic emission layer. The organic emission layer may be a light emitting layer of an organic light emitting diode (OLED).

When the organic emission layer of the intermediate layer 114 is formed of a low molecular weight organic material, a hole transport layer (HTL) and a hole injection layer (HIL) may be stacked between the organic emission layer and the first electrode 112, with an electron transport layer (ETL) and an electron injection layer (EIL) stacked between the organic emission layer and the second electrode 115. Various other layers may be stacked if needed. The intermediate layer 114 may include any of various materials such as copper phthalocyanine (CuPc), N,N'-Di(naphthalene-1-yl)-N,N'-diphenyl-benzidine (NPB), or tris-8-hydroxyquinoline aluminum (Alq3). When the organic emission layer of the intermediate layer 114 is formed of a polymer organic material, only a hole transport layer (HTL) may be interposed between the organic emission layer and the first electrode 112. The hole transport layer (HTL) may be formed of poly-(2,4)-ethylene-dihydroxy thiophene (PEDOT), polyaniline (PANI), or the like on the first electrode 112 by, e.g., inkjet printing or spin coating.

The organic emission layer of the intermediate layer 114 may be formed of poly-phenylenevinylene (PPV), soluble PPV's, cyano-PPV, polyfluorene, or the like. The organic emission layer of the intermediate layer 114 may be formed to have a pattern by using a typical patterning method such as inkjet printing, spin coating, or thermal transferring.

In the example embodiment shown in FIG. 1, the second electrode 115 is formed to cover all pixels. In an implementation, the display apparatus may be bottom-emitting, and the second electrode 115 may be reflective. However, embodiments are not limited thereto. The second electrode 115 may be formed of any of various conductive materials. The second electrode 115 may be formed of Ag, Mg, Al, Pt, Pd, Au, Ni, Nd, Ir, Cr, Li, Ca, or the like.

A sealing member (not shown) may be disposed on the second electrode 115. The sealing member may be formed to protect the intermediate layer 114 and other layers from external moisture, oxygen, or the like, and may be formed of a transparent material. To this end, the sealing member may have a multi-layered structure obtained by a glass, a plastic, or a stacked structure of an inorganic material and an organic material.

In the organic light emitting display apparatus 100 according to the present embodiment, the light conversion layer 107 is formed on a path where light generated by the intermediate layer 114 travels. For example, the light conversion layer 107 is disposed below the first electrode 112. The light conversion layer 107 includes an oxide semiconductor that has a higher refractive index than that of silicon oxide included in the passivation layer 111. Thus, light heading toward the substrate 101 from among the light generated by the intermediate layer 114 is partially reflected by an interface between the passivation layer 111 and the light conversion layer 107. The light reflected by the interface between the passivation layer 111 and the light conversion layer 107 heads back toward the intermediate layer 114 and is reflected again by the first electrode 112 or the intermediate layer 114. Accordingly, the light generated by the intermediate layer 114 may resonate in a space between the intermediate layer 114 and the light conversion layer 107. As such, a microcavity effect may be generated. Amplified light obtained due to the resonance is extracted toward the substrate 101, so that light efficiency is improved as seen from the viewpoint of users.

The light conversion layer 107 may absorb light having a specific frequency. In other words, the light conversion layer 107 including an oxide semiconductor absorbs light having a specific frequency from among the light generated by the intermediate layer 114. For example, the light conversion layer 107 absorbs light corresponding to a wavelength band other than a major wavelength band of visible light. Accordingly, the organic light emitting display apparatus 100 having an improved optical spectrum may be obtained.

In the organic light emitting display apparatus 100 according to the present embodiment, the gate insulating film 105 and the buffer layer 102 are disposed between the light conversion layer 107 and the substrate 101. The light heading toward the substrate 101 from among the light emitted by the intermediate layer 114 is partially reflected by the light conversion layer 107 and partially transmitted by the light conversion layer 107. The light transmitted by the light conversion layer 107 is partially reflected by an interface between the gate insulating film 105 and the buffer layer 102, e.g., where the buffer layer 102 including silicon nitride has a higher refractive index than that of the gate insulating film 105 including silicon oxide. Thus, the effective path length traveled by the light may be altered by altering a spacing between layers and/or altering differences in refractive indices.

The light reflected by the interface between the buffer layer 102 and the light conversion layer 105 heads back toward the intermediate layer 114 and is reflected again by the first electrode 112 or the intermediate layer 114. Accordingly, the light emitted from the intermediate layer 114 resonates in a space between the intermediate layer 114 and the buffer layer 102. Amplified light obtained due to the resonance is extracted and output toward the substrate 101, so that light efficiency is improved as seen from the viewpoint of users.

As described above, in the organic light emitting display apparatus 100 according to the present embodiment, light resonance occurs in the space between the intermediate layer 114 and the light conversion layer 107, and in the space between the intermediate layer 114 and the buffer layer 102. Since the two spaces where light resonance occurs have different effective lengths, luminescent efficiency in various wavelength ranges may be improved.

In addition, when the light conversion layer 107 is formed to achieve light resonance, and the light conversion layer 107 is formed on the same layer on which the active layer 106 is formed and is formed of the same material as that of the active layer 106, process convenience increases and the entire thickness of the organic light emitting display apparatus 100 is not increased, thereby facilitating thinning of the organic light emitting display apparatus 100.

Figure 2:
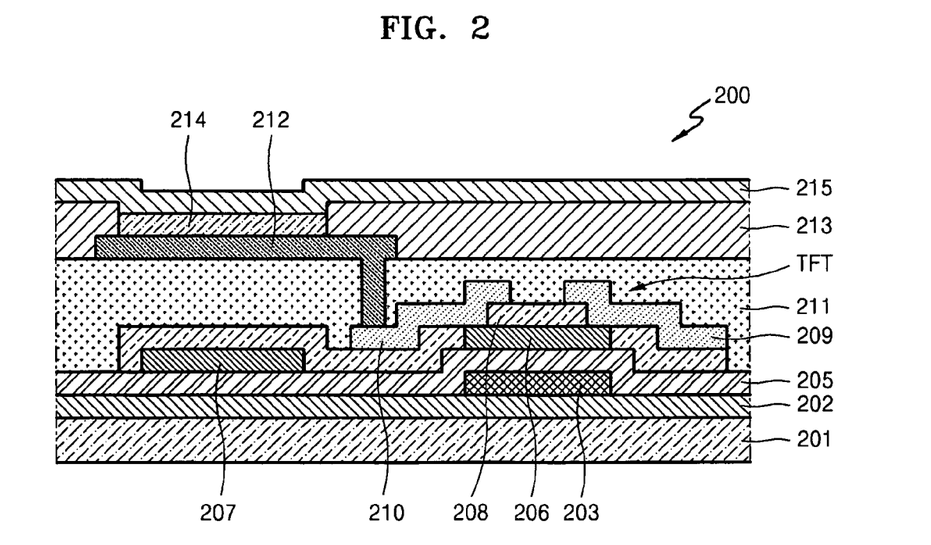
FIG. 2 illustrates a schematic cross-sectional view of an organic light emitting display apparatus according to another embodiment.

FIG. 2 illustrates a schematic cross-sectional view of an organic light emitting display apparatus 200 according to another embodiment. For convenience of explanation, the present embodiment of FIG. 2 will now be described by focusing on differences between the present embodiment and the previous embodiment of FIG. 1.

In the example embodiment shown in FIG. 2, the organic light emitting display apparatus 200 includes a substrate 201, a thin film transistor TFT, a light conversion layer 207, a passivation layer 211, a first electrode 212, an intermediate layer 214, and a second electrode 215. The thin film transistor TFT includes a gate electrode 203, an active layer 206, a source electrode 209, and a drain electrode 210.

In the example embodiment shown in FIG. 2, the buffer layer 202 is formed on the substrate 201. The gate electrode 203 is formed on the buffer layer 202. The gate insulating film 205 is formed on the gate electrode 203. The active layer 206 is formed on the gate insulating film 205.

In the example embodiment shown in FIG. 2, the light conversion layer 207 is formed on the gate insulating film 205 and includes the same material as the material used to form the active layer 206.

In the example embodiment shown in FIG. 2, an etch stopper 208 is formed on the active layer 206. At this time, the etch stopper 208 is formed to cover the light conversion layer 207. Thus, the etch stopper 208 is also disposed between the light conversion layer 207 and the passivation layer 211.

In the example embodiment shown in FIG. 2, the source electrode 209 and the drain electrode 210 are formed on the etch stopper 208. The source electrode 209 and the drain electrode 210 contact portions of the active layer 206 that are not covered with the etch stopper 208 and that are exposed.

In the example embodiment shown in FIG. 2, the passivation layer 211 is formed on the source electrode 209, the drain electrode 210, and a portion of the etch stopper 208 covering the light conversion layer 207.

In the example embodiment shown in FIG. 2, the first electrode 212 is formed on the passivation layer 211. The first electrode 212 is electrically connected to the drain electrode 210. A pixel defining film 213 is formed on the first electrode 212. The pixel defining film 113 is formed to expose a predetermined portion of the first electrode 212, and forms the intermediate layer 214 on the exposed portion of the first electrode 212. The second electrode 215 is formed on the intermediate layer 214.

In the example embodiment shown in FIG. 2, the intermediate layer 214 includes an organic emission layer (not shown). When a voltage is applied to the first electrode 212 and the second electrode 215, visible light is emitted from the organic emission layer.

A sealing member (not shown) may be disposed on the second electrode 215. The sealing member may be formed to protect the intermediate layer 214 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 200 according to the present embodiment are the same as those used in the previous embodiment, and thus a detailed description thereof will not be repeated.

In the organic light emitting display apparatus 200 according to the present embodiment, light generated by the intermediate layer 214 resonates in a space between the intermediate layer 214 and the light conversion layer 207, and thus light efficiency is improved.

The light conversion layer 207 may absorb light having a specific frequency, and thus the organic light emitting display apparatus 200 having an improved optical spectrum may be obtained.

In the organic light emitting display apparatus 200 according to the present embodiment, the light emitted from the intermediate layer 214 also resonates in a space between the intermediate layer 214 and the buffer layer 202, and thus light efficiency is improved.

In addition, the light conversion layer 207 is formed on the same layer on which the active layer 206 is formed, and formed of the same material as that of the active layer 206. Thus, process convenience increases, and the entire thickness of the organic light emitting display apparatus 200 is not increased, thereby facilitating thinning of the organic light emitting display apparatus 200.

In the organic light emitting display apparatus 200 according to the present embodiment, since the etch stopper 208 is disposed on the light conversion layer 207, a space where light resonates is lengthened. Compared with FIG. 1, the length of the space between the intermediate layer 214 and the light conversion layer 207 where light resonance occurs is increased by an amount corresponding to a thickness of the etch stopper 208. Likewise, compared with FIG. 1, the length of the space between the intermediate layer 214 and the buffer layer 202 where light resonance occurs is increased by the thickness of the etch stopper 208.

Extracted light characteristics vary according to the length of the space where light resonance occurs. In the present embodiment, the length of the space where light resonance occurs is controlled by adjusting the thickness of the etch stopper 208, so that optimal light efficiency may be easily obtained from light resonance occurring in a length-controlled space.

Figure 3:
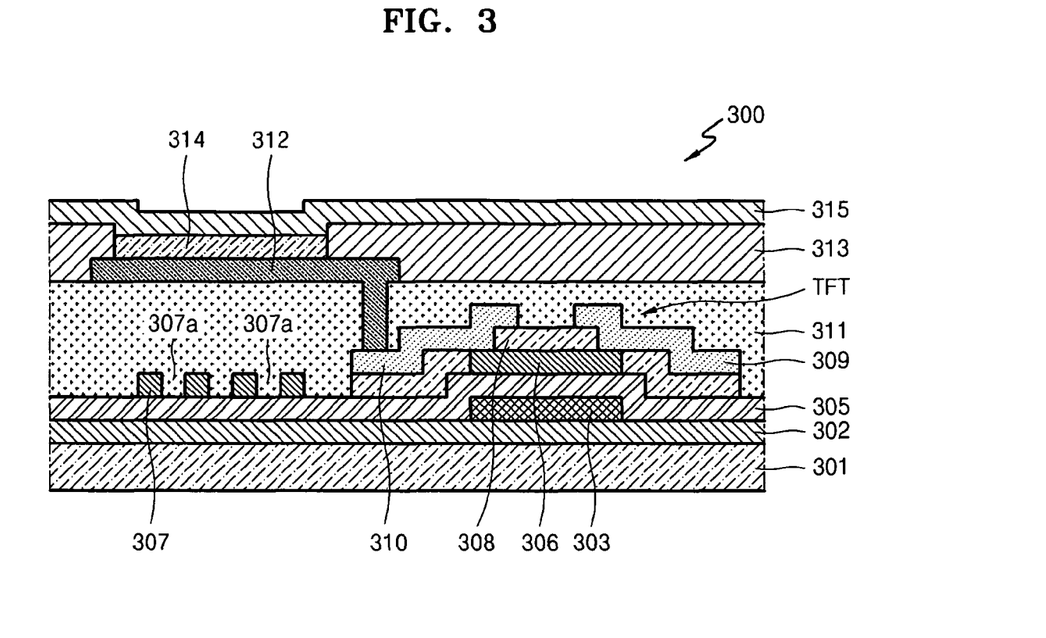
FIG. 3 illustrates a schematic cross-sectional view of an organic light emitting display apparatus according to another embodiment.

FIG. 3 illustrates a schematic cross-sectional view of an organic light emitting display apparatus 300 according to another embodiment. For convenience of explanation, the present embodiment of FIG. 3 will now be described by focusing on differences between the present embodiment and the previous embodiments of FIGS. 1 and 2.

In the example embodiment shown in FIG. 3, the organic light emitting display apparatus 300 includes a substrate 301, a thin film transistor TFT, a light conversion layer 307, a passivation layer 311, a first electrode 312, an intermediate layer 314, and a second electrode 315. The thin film transistor TFT includes a gate electrode 303, an active layer 306, a source electrode 309, and a drain electrode 310.

In the example embodiment shown in FIG. 3, the buffer layer 302 is formed on the substrate 301. The gate electrode 303 is formed on the buffer layer 302. The gate insulating film 305 is formed on the gate electrode 303. The active layer 306 is formed on the gate insulating film 305.

In the example embodiment shown in FIG. 3, the light conversion layer 307 is formed on the gate insulating film 305 and includes the same material as the material used to form the active layer 306.

In the example embodiment shown in FIG. 3, the light conversion layer 307 has a predetermined pattern, e.g., being formed to have a plurality of through holes 307a. Due to the pattern of the light conversion layer 307, light incident on the light conversion layer 307 is scattered.

In the example embodiment shown in FIG. 3, an etch stopper 308 is formed on the active layer 306. The source electrode 309 and the drain electrode 310 are formed on the etch stopper 308. The source electrode 309 and the drain electrode 310 contact portions of the active layer 306 that are not covered with the etch stopper 308 and that are exposed.

In the example embodiment shown in FIG. 3, the passivation layer 311 is formed on the light conversion layer 307, the source electrode 309, and the drain electrode 310.

In the example embodiment shown in FIG. 3, the first electrode 312 is formed on the passivation layer 311. The first electrode 312 is electrically connected to the drain electrode 310. A pixel defining film 313 is formed on the first electrode 312. The pixel defining film 313 is formed to expose a predetermined portion of the first electrode 312, and forms the intermediate layer 314 on the exposed portion of the first electrode 312. The second electrode 315 is formed on the intermediate layer 314.

In the example embodiment shown in FIG. 3, the intermediate layer 314 includes an organic emission layer (not shown). When a voltage is applied to the first electrode 312 and the second electrode 315, visible light is emitted from the organic emission layer.

A sealing member (not shown) may be disposed on the second electrode 315. The sealing member may be formed to protect the intermediate layer 314 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 300 according to the present embodiment are the same as those used in the previous embodiments, and thus a detailed description thereof will not be repeated.

In the organic light emitting display apparatus 300 according to the present embodiment, light generated by the intermediate layer 314 resonates in a space between the intermediate layer 314 and the light conversion layer 307, and thus light efficiency is improved.

The light conversion layer 307 may absorb light having a specific frequency, and thus the organic light emitting display apparatus 300 having an improved optical spectrum may be obtained.

In the organic light emitting display apparatus 300 according to the present embodiment, the light emitted from the intermediate layer 314 also resonates in a space between the intermediate layer 314 and the buffer layer 302, and thus light efficiency is improved.

In addition, the light conversion layer 307 is formed on the same layer on which the active layer 306 is formed, and is formed of the same material as the active layer 306. Thus, process convenience increases, and the entire thickness of the organic light emitting display apparatus 300 is not increased, thereby facilitating thinning of the organic light emitting display apparatus 300.

In the organic light emitting display apparatus 300 according to the present embodiment, the light conversion layer 307 includes the plurality of through holes 307a formed in a predetermined pattern. Due to the pattern of the light conversion layer 307, a portion of light generated by the intermediate layer 314 and heading toward the light conversion layer 307 is scattered on corners and inner surfaces of the through holes 307a of the light conversion layer 307. Accordingly, a large amount of light is extracted and thus light efficiency is improved, as seen from the viewpoint of users.

Figure 4:
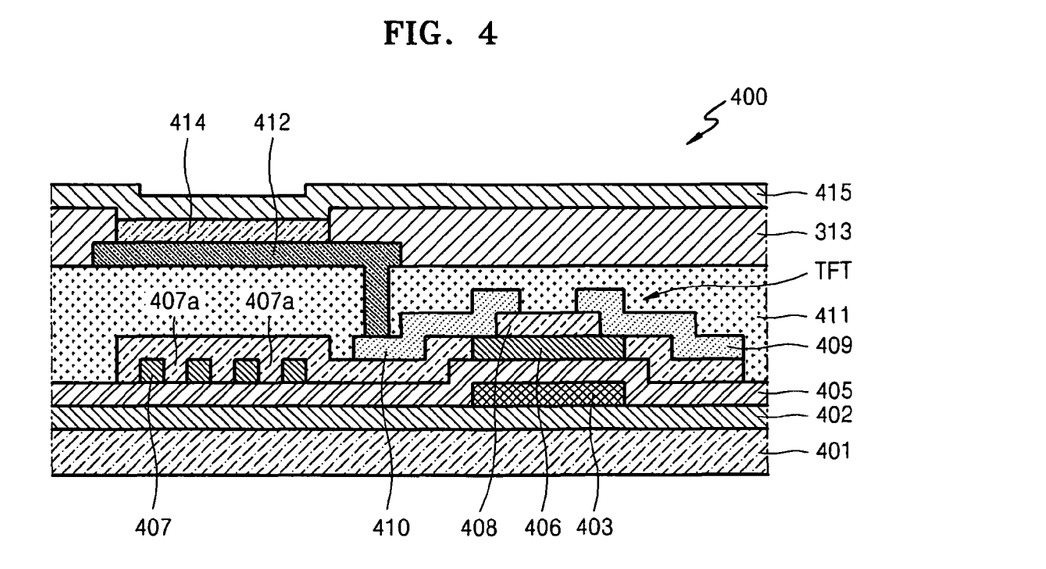
FIG. 4 illustrates a schematic cross-sectional view of an organic light emitting display apparatus according to another embodiment.

FIG. 4 illustrates a schematic cross-sectional view of an organic light emitting display apparatus 400 according to another embodiment. For convenience of explanation, the present embodiment of FIG. 4 will now be described by focusing on differences between the present embodiment and the previous embodiments of FIGS. 1, 2, and 3.

In the example embodiment shown in FIG. 4, the organic light emitting display apparatus 400 includes a substrate 401, a thin film transistor TFT, a light conversion layer 407, a passivation layer 411, a first electrode 412, an intermediate layer 414, and a second electrode 415. The thin film transistor TFT includes a gate electrode 403, an active layer 406, a source electrode 409, and a drain electrode 410.

In the example embodiment shown in FIG. 4, the buffer layer 402 is formed on the substrate 401. The gate electrode 403 is formed on the buffer layer 402. The gate insulating film 405 is formed on the gate electrode 403. The active layer 406 is formed on the gate insulating film 405.

In the example embodiment shown in FIG. 4, the light conversion layer 407 is formed on the gate insulating film 405 and includes the same material as the material used to form the active layer 406.

In the example embodiment shown in FIG. 4, the light conversion layer 407 has a predetermined pattern, e.g., being formed to have a plurality of through holes 407a. Due to the pattern of the light conversion layer 407, light incident toward the light conversion layer 407 is scattered.

In the example embodiment shown in FIG. 4, an etch stopper 408 is formed on the active layer 406. At this time, the etch stopper 408 is formed to cover the light conversion layer 407. Thus, the etch stopper 408 is also disposed between the light conversion layer 407 and the passivation layer 411. The source electrode 409 and the drain electrode 410 contact portions of the active layer 406 that are not covered with the etch stopper 408 and that are exposed.

In the example embodiment shown in FIG. 4, the passivation layer 411 is formed on the source electrode 409, the drain electrode 410, and a portion of the etch stopper 408 covering the light conversion layer 407.

In the example embodiment shown in FIG. 4, the first electrode 412 is formed on the passivation layer 411. The first electrode 412 is electrically connected to the drain electrode 410. A pixel defining film 413 is formed on the first electrode 412. The pixel defining film 413 is formed to expose a predetermined portion of the first electrode 412, and forms the intermediate layer 414 on the exposed portion of the first electrode 412. The second electrode 415 is formed on the intermediate layer 414.

In the example embodiment shown in FIG. 4, the intermediate layer 414 includes an organic emission layer (not shown). When a voltage is applied to the first electrode 412 and the second electrode 415, visible light is emitted from the organic emission layer.

A sealing member (not shown) may be disposed on the second electrode 415. The sealing member may be formed to protect the intermediate layer 414 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 400 according to the present embodiment are the same as those used in the previous embodiment, and thus a detailed description thereof will not be repeated.

In the organic light emitting display apparatus 400 according to the present embodiment, light generated by the intermediate layer 414 resonates in a space between the intermediate layer 414 and the light conversion layer 407, and thus light efficiency is improved.

The light conversion layer 407 may absorb light having a specific frequency, and thus the organic light emitting display apparatus 400 having an improved optical spectrum may be obtained.

In the organic light emitting display apparatus 400 according to the present embodiment, the light emitted from the intermediate layer 414 also resonates in a space between the intermediate layer 414 and the buffer layer 402, and thus light efficiency is improved.

In addition, the light conversion layer 407 is formed on the same layer on which the active layer 406 is formed, and is formed of the same material as the active layer 406. Thus, process convenience increases, and the entire thickness of the organic light emitting display apparatus 400 is not increased, thereby facilitating thinning of the organic light emitting display apparatus 400.

In the organic light emitting display apparatus 400 according to the present embodiment, the light conversion layer 407 includes the plurality of through holes 407a formed in a predetermined pattern. Due to the pattern of the light conversion layer 407, a portion of light generated by the intermediate layer 414 and heading toward the light conversion layer 407 is scattered on corners and inner surfaces of the through holes 407a of the light conversion layer 407. Accordingly, a large amount of light is extracted and thus light efficiency is improved, as seen from the viewpoint of users.

In the organic light emitting display apparatus 400 according to the present embodiment, since the etch stopper 408 is disposed on the light conversion layer 207, an space where light resonates is lengthened. Compared with FIG. 1, the length of the space where light resonance occurs is increased by an amount corresponding to a thickness of the etch stopper 408. The length of the space where light resonance occurs is controlled by adjusting the thickness of the etch stopper 408, so that optimal light efficiency may be easily obtained from light resonance occurring in a length-controlled space.

Figure 5:
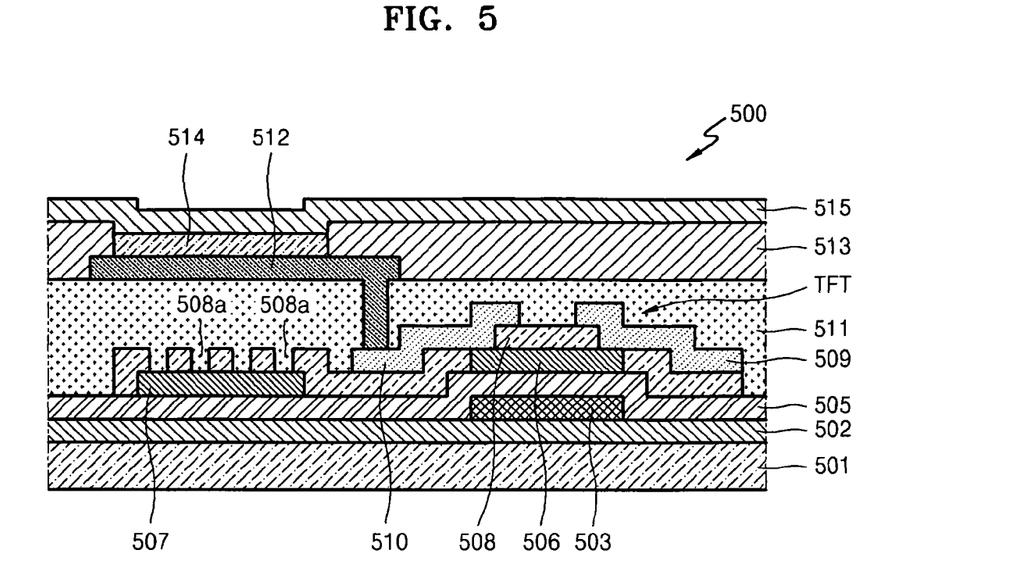
FIG. 5 illustrates a schematic cross-sectional view of an organic light emitting display apparatus according to another embodiment.

FIG. 5 illustrates a schematic cross-sectional view of an organic light emitting display apparatus 500 according to another embodiment. For convenience of explanation, the present embodiment of FIG. 5 will now be described by focusing on differences between the present embodiment and the previous embodiments of FIGS. 1 through 4.

In the example embodiment shown in FIG. 5, the organic light emitting display apparatus 500 includes a substrate 501, a thin film transistor TFT, a light conversion layer 507, a passivation layer 511, a first electrode 512, an intermediate layer 514, and a second electrode 515. The thin film transistor TFT includes a gate electrode 503, an active layer 506, a source electrode 509, and a drain electrode 510.

In the example embodiment shown in FIG. 5, the buffer layer 502 is formed on the substrate 501. The gate electrode 503 is formed on the buffer layer 502. The gate insulating film 505 is formed on the gate electrode 503. The active layer 506 is formed on the gate insulating film 505.

In the example embodiment shown in FIG. 5, the light conversion layer 507 is formed on the gate insulating film 505 and includes the same material as the material used to form the active layer 506.

In the example embodiment shown in FIG. 5, an etch stopper 508 is formed on the active layer 506. At this time, the etch stopper 508 is formed to cover the light conversion layer 507. The etch stopper 508 has a predetermined pattern, being formed to have a plurality of through holes 508a so as to expose predetermined portions of the light conversion layer 507. All of the through holes 508a face the light conversion layer 507. Due to the pattern of the etch stopper 508, light incident on the light conversion layer 507 is scattered.

In the example embodiment shown in FIG. 5, the source electrode 509 and the drain electrode 510 contact portions of the active layer 506 that are not covered with the etch stopper 508 and that are exposed.

In the example embodiment shown in FIG. 5, the passivation layer 511 is formed on the source electrode 409, the drain electrode 510, and a portion of the etch stopper 508 covering the light conversion layer 507.

In the example embodiment shown in FIG. 5, the first electrode 512 is formed on the passivation layer 511. The first electrode 512 is electrically connected to the drain electrode 510. A pixel defining film 513 is formed on the first electrode 512. The pixel defining film 513 is formed to expose a predetermined portion of the first electrode 512, and forms the intermediate layer 514 on the exposed portion of the first electrode 512. The second electrode 515 is formed on the intermediate layer 514.

In the example embodiment shown in FIG. 5, the intermediate layer 514 includes an organic emission layer (not shown). When a voltage is applied to the first electrode 512 and the second electrode 515, visible light is emitted from the organic emission layer.

A sealing member (not shown) may be disposed on the second electrode 515. The sealing member may be formed to protect the intermediate layer 514 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 500 according to the present embodiment are the same as those used in the previous embodiments, and thus a detailed description thereof will not be repeated.

In the organic light emitting display apparatus 500 according to the present embodiment, light generated by the intermediate layer 514 resonates in a space between the intermediate layer 514 and the light conversion layer 507, and thus light efficiency is improved.

The light conversion layer 507 may absorb light having a specific frequency, and thus the organic light emitting display apparatus 500 having an improved optical spectrum may be obtained.

In the organic light emitting display apparatus 500 according to the present embodiment, the light emitted from the intermediate layer 514 also resonates in a space between the intermediate layer 514 and the buffer layer 502, and thus light efficiency is improved.

In addition, the light conversion layer 507 is formed on the same layer on which the active layer 506 is formed, and formed of the same material as the active layer 506. Thus, process convenience increases, and the entire thickness of the organic light emitting display apparatus 500 is not increased, thereby facilitating thinning of the organic light emitting display apparatus 500.

In the organic light emitting display apparatus 500 according to the present embodiment, the etch stopper 508 includes the plurality of through holes 508a formed in a predetermined pattern. Due to the pattern of the etch stopper 508, a portion of light generated by the intermediate layer 514 and heading toward the light conversion layer 507 is scattered on corners and inner surfaces of the through holes 508a of the etch stopper 508. Accordingly, a large amount of light is extracted and thus light efficiency is improved, as seen from the viewpoint of users.

In addition, the length of the space where light resonance occurs is controlled by adjusting the thickness of the etch stopper 508, so that optimal light efficiency may be easily obtained from light resonance occurring in a length-controlled space.

Figure 6:
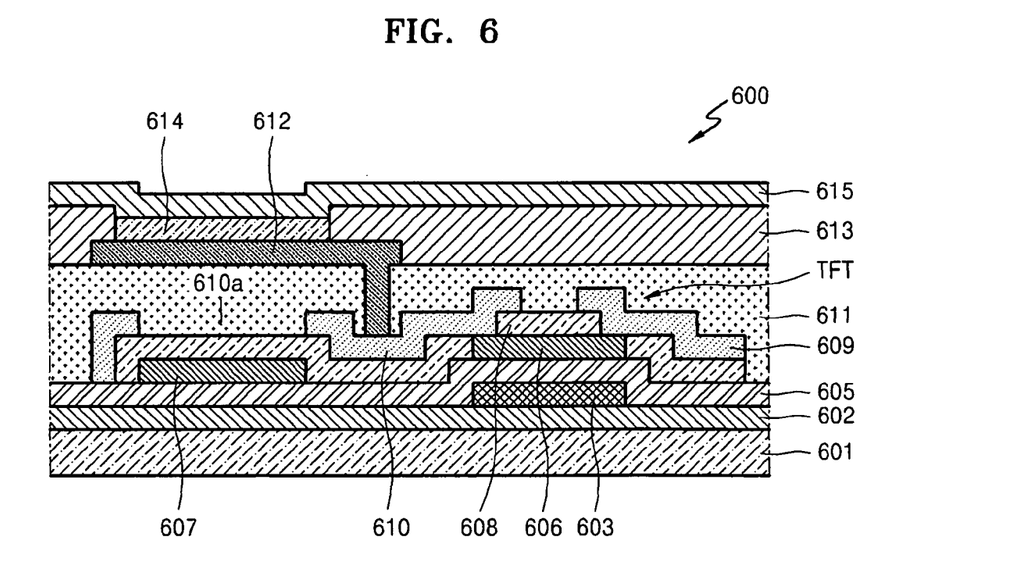
FIG. 6 illustrates a schematic cross-sectional view of an organic light emitting display apparatus according to another embodiment.

FIG. 6 illustrates a schematic cross-sectional view of an organic light emitting display apparatus 600 according to another embodiment. For convenience of explanation, the present embodiment of FIG. 6 will now be described by focusing on differences between the present embodiment and the previous embodiments of FIGS. 1 through 5.

In the example embodiment shown in FIG. 6, the organic light emitting display apparatus 600 includes a substrate 601, a thin film transistor TFT, a light conversion layer 607, a passivation layer 611, a first electrode 612, an intermediate layer 614, and a second electrode 615. The thin film transistor TFT includes a gate electrode 603, an active layer 606, a source electrode 609, and a drain electrode 610.

In the example embodiment shown in FIG. 6, the buffer layer 602 is formed on the substrate 601. The gate electrode 603 is formed on the buffer layer 602. The gate insulating film 605 is formed on the gate electrode 603. The active layer 606 is formed on the gate insulating film 605.

In the example embodiment shown in FIG. 6, the light conversion layer 607 is formed on the gate insulating film 605 and includes the same material as the material used to form the active layer 606.

In the example embodiment shown in FIG. 6, an etch stopper 608 is formed on the active layer 606. At this time, the etch stopper 608 is formed to cover the light conversion layer 607.

In the example embodiment shown in FIG. 6, the source electrode 609 and the drain electrode 610 are formed on the etch stopper 608. The source electrode 609 and the drain electrode 610 contact portions of the active layer 606 that are not covered with the etch stopper 608 and that are exposed.

The source electrode 609 or the drain electrode 610 may extend to reach an edge of the light conversion layer 607. In the present embodiment, the drain electrode 610 extends to reach the edge of the light conversion layer 607, i.e., the drain electrode 610 extends over regions near edges of the light conversion layer 607.

In the example embodiment shown in FIG. 6, the drain electrode 610 includes a through hole 610a formed to face the light conversion layer 607. Accordingly, light emitted from the intermediate layer 614 does not pass through the regions around the light conversion layer 607, but does pass through the through hole 610a so as to propagate toward the light conversion layer 607.

In the example embodiment shown in FIG. 6, the passivation layer 611 is formed on the source electrode 609, the drain electrode 610, and a portion of the etch stopper 608 covering the light conversion layer 607.

In the example embodiment shown in FIG. 6, the first electrode 612 is formed on the passivation layer 611. The first electrode 612 is electrically connected to the drain electrode 610. A pixel defining film 613 is formed on the first electrode 612. The pixel defining film 613 is formed to expose a predetermined portion of the first electrode 612, and forms the intermediate layer 614 on the exposed portion of the first electrode 612. The second electrode 615 is formed on the intermediate layer 614.

In the example embodiment shown in FIG. 6, the intermediate layer 614 includes an organic emission layer (not shown). When a voltage is applied to the first electrode 612 and the second electrode 615, visible light is emitted from the organic emission layer.

A sealing member (not shown) may be disposed on the second electrode 615. The sealing member may be formed to protect the intermediate layer 614 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 600 according to the present embodiment are the same as those used in the previous embodiments, and thus a detailed description thereof will not be repeated.

In the organic light emitting display apparatus 600 according to the present embodiment, light generated by the intermediate layer 614 resonates in a space between the intermediate layer 614 and the light conversion layer 607, and thus light efficiency is improved. The light emitted from the intermediate layer 614 also resonates in a space between the intermediate layer 614 and the buffer layer 602, and thus light efficiency is improved.

The light conversion layer 607 may absorb light having a specific frequency, and thus the organic light emitting display apparatus 600 having an improved optical spectrum may be obtained.

In addition, the light conversion layer 607 is formed on the same layer on which the active layer 606 is formed, and is formed of the same material as the active layer 606. Thus, process convenience increases, and the entire thickness of the organic light emitting display apparatus 600 is not increased, thereby facilitating thinning of the organic light emitting display apparatus 600.

In the organic light emitting display apparatus 600 according to the present embodiment, the etch stopper 608 is disposed on the light conversion layer 607, and an length of a space where light resonance occurs is controlled by adjusting the thickness of the etch stopper 608, so that optimal light efficiency may be easily obtained from light resonance occurring in a length-controlled space.

In addition, the drain electrode 610 extends over the edge of the light conversion layer 607. Accordingly, the light generated from the intermediate layer 614 is prevented from passing through the regions around the light conversion layer 607, and thus a higher percentage of light passes through the light conversion layer 607, thereby increasing the light efficiency. Consequently, display contrast is increased.

Although not shown, a structure of the present embodiment may be applied to structures in which no etch stoppers 608 are installed on the light conversion layer 607, structures in which the light conversion layer 607 is patterned, and other various structures.

Figure 7:
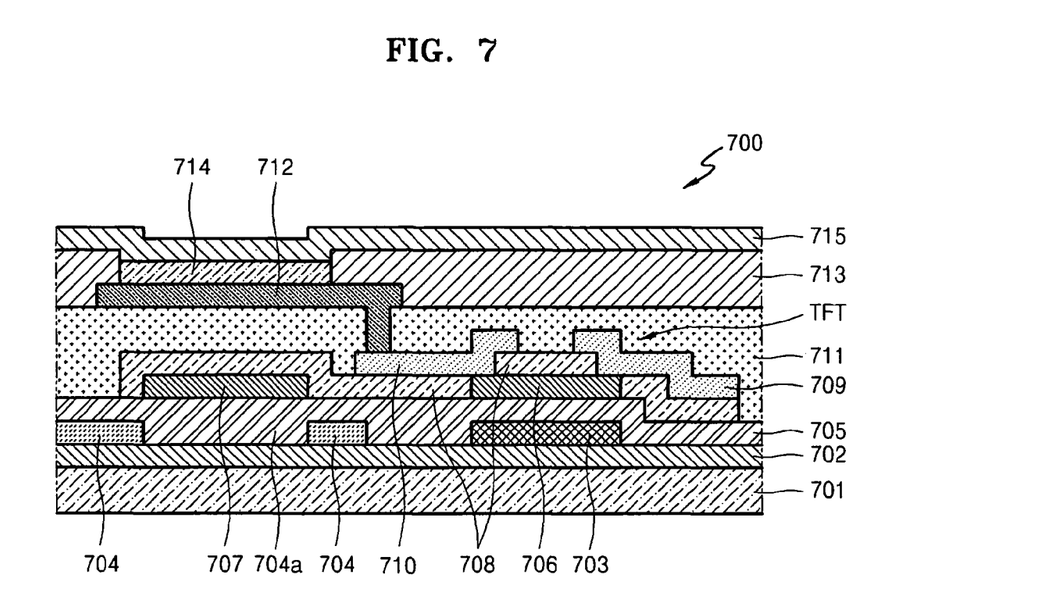
FIG. 7 illustrates a schematic cross-sectional view of an organic light emitting display apparatus according to another embodiment.

FIG. 7 illustrates a schematic cross-sectional view of an organic light emitting display apparatus 700 according to another embodiment. For convenience of explanation, the present embodiment of FIG. 7 will now be described by focusing on differences between the present embodiment and the previous embodiments of FIGS. 1 through 6.

In the example embodiment shown in FIG. 7, the organic light emitting display apparatus 700 includes a substrate 701, a light blocking layer 704, a thin film transistor TFT, a light conversion layer 707, a passivation layer 711, a first electrode 712, an intermediate layer 714, and a second electrode 715.

The thin film transistor TFT includes a gate electrode 703, an active layer 706, a source electrode 709, and a drain electrode 710.

In the example embodiment shown in FIG. 7, the buffer layer 702 is formed on the substrate 701. The gate electrode 703 is formed on the buffer layer 702. The light blocking layer 704 is also formed on the buffer layer 702 so as to be separated from the gate electrode 703. The light blocking layer 704 is formed of the same material as that used to form the gate electrode 703. The light blocking layer 704 includes a through hole 704a for blocking light incident upon regions around the light conversion layer 707, and a detailed description thereof will be made below.

In the example embodiment shown in FIG. 7, the gate insulating film 705 is formed on the gate electrode 703 and the light blocking layer 704. The active layer 706 is formed on the gate insulating film 705.

In the example embodiment shown in FIG. 7, the light conversion layer 707 is formed on the gate insulating film 705 and includes the same material as that used to form the active layer 706. The light conversion layer 707 is formed to face the through hole 704a of the light blocking layer 704. Accordingly, light not passing through the regions around the light conversion layer 707 but traveling toward the light conversion layer 707 from among light emitted from the intermediate layer 714 is extracted through the through hole 704a.

In the example embodiment shown in FIG. 7, an etch stopper 708 is formed on the active layer 706. At this time, the etch stopper 708 is formed to cover the light conversion layer 707.

In the example embodiment shown in FIG. 7, the source electrode 709 and the drain electrode 710 are formed on the etch stopper 708. The source electrode 709 and the drain electrode 710 contact portions of the active layer 706 that are not covered with the etch stopper 708 and that are exposed.

In the example embodiment shown in FIG. 7, the passivation layer 711 is formed on the source electrode 709, the drain electrode 710, and a portion of the etch stopper 708 covering the light conversion layer 707.

In the example embodiment shown in FIG. 7, the first electrode 712 is formed on the passivation layer 711. The first electrode 712 is electrically connected to the drain electrode 710. A pixel defining film 713 is formed on the first electrode 712. The pixel defining film 713 is formed to expose a predetermined portion of the first electrode 712, and forms the intermediate layer 714 on the exposed portion of the first electrode 712. The second electrode 715 is formed on the intermediate layer 714.

In the example embodiment shown in FIG. 7, the intermediate layer 714 includes an organic emission layer (not shown). When a voltage is applied to the first electrode 712 and the second electrode 715, visible light is emitted from the organic emission layer.

A sealing member (not shown) may be disposed on the second electrode 715. The sealing member may be formed to protect the intermediate layer 714 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 700 according to the present embodiment are the same as those used in the previous embodiments, and thus a detailed description thereof will not be repeated.

In the organic light emitting display apparatus 700 according to the present embodiment, the light generated by the intermediate layer 714 resonates in a space between the intermediate layer 714 and the light conversion layer 707, and thus light efficiency is improved. The light emitted from the intermediate layer 714 also resonates in a space between the intermediate layer 714 and the buffer layer 702, and thus light efficiency is improved.

In addition, the light conversion layer 707 may absorb light having a specific frequency, and thus the organic light emitting display apparatus 700 having an improved optical spectrum may be obtained.

Moreover, the light conversion layer 707 is formed on the same layer on which the active layer 706 is formed, and is formed of the same material as the active layer 706. Thus, process convenience increases, and the entire thickness of the organic light emitting display apparatus 700 is not increased, thereby facilitating thinning of the organic light emitting display apparatus 700.

In the organic light emitting display apparatus 700 according to the present embodiment, the etch stopper 708 is disposed on the light conversion layer 707, and an length of a space where light resonance occurs is controlled by adjusting the thickness of the etch stopper 708, so that optimal light efficiency may be easily obtained from light resonance occurring in a length-controlled space.

In the organic light emitting display apparatus 700 according to the present embodiment, the light blocking layer 704 is formed on the buffer layer 702. Accordingly, the light generated from the intermediate layer 714 is prevented from passing through the regions around the light conversion layer 707, and thus a higher percentage of light passes through the light conversion layer 707, thereby increasing the light efficiency. Consequently, display contrast is increased.

Although not shown, a structure of the present embodiment may be applied to structures in which no etch stoppers 708 are installed on the light conversion layer 607, structures in which the light conversion layer 707 is patterned, and other various structures.

Figure 8:
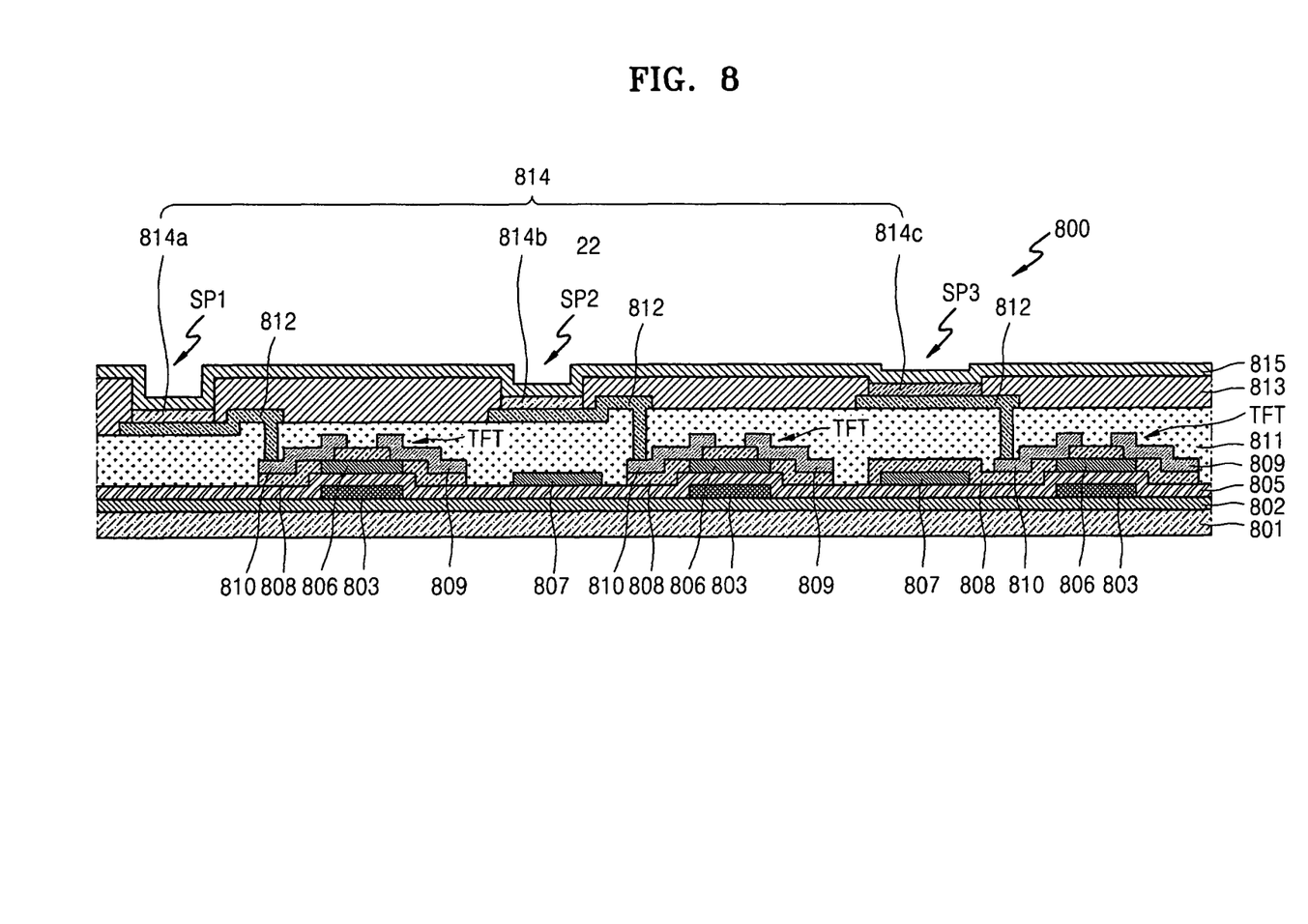
FIG. 8 illustrates a schematic cross-sectional view of an organic light emitting display apparatus according to another embodiment.

FIG. 8 illustrates a schematic cross-sectional view of an organic light emitting display apparatus 800 according to another embodiment. For convenience of explanation, the present embodiment of FIG. 8 will now be described by focusing on differences between the present embodiment and the previous embodiments of FIGS. 1 through 7.

In the example embodiment shown in FIG. 8, the organic light emitting display apparatus 800 includes a first subpixel SP1, a second subpixel SP2, and a third subpixel SP3. The first, second, and third subpixels SP1, SP2, and SP3 may be different color subpixels.

For convenience of explanation, one single first subpixel SP1, one single second subpixel SP2, and one single third subpixel SP3 are illustrated in FIG. 8. However, the organic light emitting display apparatus 800 may include a plurality of first subpixels SP1, a plurality of second subpixels SP2, and a plurality of third subpixels SP3.

In the example embodiment shown in FIG. 8, the first subpixel SP1 includes a passivation layer 811, a first electrode 812, a first intermediate layer 814a including a first organic emission layer, and a second electrode 815. The second subpixel SP2 includes a light conversion layer 807 containing an oxide semiconductor, a passivation layer 811, a first electrode 812, a second intermediate layer 814b including a second organic emission layer, and a second electrode 815. The third subpixel SP3 includes a light conversion layer 807, an etch stopper 808, a passivation layer 811, a first electrode 812, a third intermediate layer 814c including a third organic emission layer, and a second electrode 815.

In the example embodiment shown in FIG. 8, the first, second, and third subpixels SP1, SP2, and SP3 include thin film transistors TFT. Each of the thin film transistors TFT includes a gate electrode 803, an active layer 806, a source electrode 809, and a drain electrode 810.

In the example embodiment shown in FIG. 8, a buffer layer 802 is formed on a substrate 801. The gate electrode 803 is formed on the buffer layer 802. A gate insulating film 805 is formed on the gate electrode 803. The active layer 806 is formed on the gate insulating film 805.

In the example embodiment shown in FIG. 8, the light conversion layer 807 is formed on the gate insulating film 805 and includes the same material as that used to form the active layer 806. The light conversion layer 807 is formed in the second and third subpixels SP2 and SP3.

In the example embodiment shown in FIG. 8, the etch stopper 808 is formed on the active layer 806. At this time, the etch stopper 808 is formed to cover the light conversion layer 807 of the third subpixel SP3.

In the example embodiment shown in FIG. 8, the source electrode 809 and the drain electrode 810 are formed on the etch stopper 808. The source electrode 809 and the drain electrode 810 contact portions of the active layer 806 that are not covered with the etch stopper 808 and that are exposed.

In the example embodiment shown in FIG. 8, the passivation layer 811 is formed on the light conversion layer 807, the etch stopper 808, the source electrode 809, and the drain electrode 810.

In the example embodiment shown in FIG. 8, the first electrode 812 is formed on the passivation layer 811. The first electrode 812 is electrically connected to the drain electrode 810. A pixel defining film 813 is formed on the first electrode 812. The pixel defining film 813 is formed to expose a predetermined portion of the first electrode 812, and forms an intermediate layer 814 on the exposed portion of the first electrode 812.

In the example embodiment shown in FIG. 8, the intermediate layer 814 includes an organic emission layer (not shown). When a voltage is applied to the first electrode 812 and the second electrode 815, visible light is emitted from the organic emission layer. The intermediate layer 814 includes the first intermediate layer 814a, the second intermediate layer 814b, and the third intermediate layer 814c. In the first subpixel SP1, the first intermediate layer 814a is formed. In the second subpixel SP2, the second intermediate layer 814b is formed. In the third subpixel SP3, the third intermediate layer 814c is formed. The first intermediate layer 814a includes the first organic emission layer, the second intermediate layer 814b includes the second organic emission layer, and the third intermediate layer 814c includes the third organic emission layer, so that the first subpixel SP1, the second subpixel SP2, and the third subpixel SP3 may emit different colors. In an implementation, a source of white light may be formed by driving the first, second, and third subpixels SP1, SP2, and SP3 to display colored light simultaneously. A color temperature of the white light displayed thereby may be adjusted by, e.g., altering light resonance effects in one or more of the first, second, and third subpixels SP1, SP2, and SP3.

In the example embodiment shown in FIG. 8, the second electrode 815 is formed on the intermediate layer 814 across the first, second, and third subpixels SP1, SP2, and SP3.

A sealing member (not shown) may be disposed on the second electrode 815. The sealing member may be formed to protect the intermediate layer 814 and other layers from external moisture, oxygen, or the like, and may be formed of a transparent material. To this end, the sealing member may have a multi-layered structure obtained by a glass, a plastic, or a stacked structure of an inorganic material and an organic material.

Materials used to form the components of the organic light emitting display apparatus 800 according to the present embodiment are the same as those used in the previous embodiments, and thus a detailed description thereof will not be repeated.

In the organic light emitting display apparatus 800 according to the present embodiment, distances between the intermediate layer 814 and the buffer layer 802 in the first, second, and third subpixels SP1, SP2, and SP3 are different. In other words, a distance between the first electrode 812 and the gate insulating film 805 in the first subpixel SP1, a distance between the first electrode 812 and the light conversion layer 807 in the second subpixel SP2, and a distance between the first electrode 812 and the etch stopper 808 covering the light conversion layer 807 in the third subpixel SP3 may be same. Accordingly, a distance between the first electrode 812 and the buffer layer 802 is shortest in the first subpixel SP1 and longest in the third subpixel SP3. Accordingly, an optical path length of light heading toward the substrate 801, reflected by the buffer layer 802, and heading back toward the intermediate layer 814 from among light generated by the intermediate layer 814 is different for each subpixel, so that light resonance independently occurs in each subpixel. Therefore, respective optimal light resonance effects may be obtained in subpixels emitting different colors.

In another implementation, an effective difference in optical path lengths in respective subpixels may be provided by differing configurations of the layers therein, e.g., by implementing different layers and/or differing thicknesses of layers so as to alter the relative position of refractive index interfaces that partially reflect light. For example, the second and third subpixels SP2, SP3 may have a same distance between the respective first electrodes 812 and the buffer layer 802. In the second subpixel SP2, the light conversion layer 807 may be spaced apart from the first electrode 812 by a predetermined distance, and an effective path length may be defined between the first electrode 812 and the interface of the light conversion layer 807/passivation layer 811. In the third subpixel SP3, the light conversion layer 807 may also be spaced apart from the first electrode 812 by the same predetermined distance, but a different effective path length may be defined between the first electrode 812 and an etch stop layer 808/passivation layer 811 interface in the third subpixel SP3. As such, distances between the respective first electrodes and the buffer layer in each subpixel may be constant while, at the same time, providing different effective path lengths and different resonance frequencies in each subpixel.

In addition, in the second subpixel SP2 and the third subpixel SP3, the light generated by the intermediate layer 814 resonates in a space between the intermediate layer 814 and the light conversion layer 807, and thus light efficiency is improved. In particular, in the third subpixel SP3, the etch stopper 808 is disposed between the light conversion layer 807 and the passivation layer 811, and thus a distance over which light resonance occurs is increased. Accordingly, light resonances occurring between the intermediate layer 814 and the light conversion layer 807 may be different in the second subpixel SP2 and the third subpixel SP3.

Moreover, the light conversion layer 807 may absorb light having a specific frequency, and thus the organic light emitting display apparatus 800 having an improved optical spectrum may be obtained.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic light emitting display, comprising:
  a substrate;
  a light conversion layer on the substrate, the light conversion layer including an oxide semiconductor that has a refractive index higher than that of silicon oxide;
  a passivation layer covering the light conversion layer;
  a first electrode on the passivation layer;
  an intermediate layer on the first electrode, the intermediate layer including an organic emission layer; and
  a second electrode on the intermediate layer,
  wherein the intermediate layer includes a first region overlapping the first electrode, and the light conversion layer overlaps the first region of the intermediate layer and wherein the light conversion layer is formed in a predetermined pattern so as to include a plurality of through holes.

2. An organic light emitting display apparatus, comprising:
  a substrate;
  a light conversion layer on the substrate, the light conversion layer including an oxide semiconductor that has a refractive index higher than that of silicon oxide;
  a passivation layer covering the light conversion layer;
  a first electrode on the passivation layer;
  an intermediate layer on the first electrode, the intermediate layer including an organic emission layer;
  a second electrode on the intermediate layer;
  a thin film transistor disposed between the passivation layer and the substrate, the thin film transistor being electrically connected to the first electrode, the thin film transistor including a gate electrode, an active layer, a source electrode, and a drain electrode; and
  an etch stopper between the active layer, the source electrode, and the drain electrode.

3. The organic light emitting display apparatus as claimed in claim 2, wherein the etch stopper is between the light conversion layer and the passivation layer.

4. The organic light emitting display apparatus as claimed in claim 2, wherein the etch stopper includes silicon oxide.

5. An organic light emitting display apparatus, comprising:
  a substrate;
  a light conversion layer on the substrate, the light conversion layer including an oxide semiconductor;
  a passivation layer covering the light conversion layer;
  a first electrode on the passivation layer;
  an intermediate layer on the first electrode, the intermediate layer including an organic emission layer;
  a second electrode on the intermediate layer; and
  a thin film transistor disposed between the passivation layer and the substrate, the thin film transistor being electrically connected to the first electrode, the thin film transistor including a gate electrode, an active layer, a source electrode, and a drain electrode, wherein:
  an etch stopper is between the light conversion layer and the passivation layer, and
  the etch stopper includes a plurality of through holes, the through holes exposing portions of the light conversion layer.

6. An organic light emitting display apparatus, comprising:
  a substrate;
  a light conversion layer on the substrate, the light conversion layer including an oxide semiconductor;
  a passivation layer covering the light conversion layer;
  a first electrode on the passivation layer;
  an intermediate layer on the first electrode, the intermediate layer including an organic emission layer;
  a second electrode on the intermediate layer;
  a thin film transistor disposed between the passivation layer and the substrate, the thin film transistor being electrically connected to the first electrode, the thin film transistor including a gate electrode, an active layer, a source electrode, and a drain electrode; and
  a light blocking layer disposed between the substrate and the light conversion layer, the light blocking layer blocking light from flowing into regions around the light conversion layer.

7. The organic light emitting display apparatus as claimed in claim 6, wherein the light blocking layer includes a through hole that faces the light conversion layer.

8. The organic light emitting display apparatus as claimed in claim 6, wherein the light blocking layer is formed of a material used to form the gate electrode.

* * * * *